US012763281B2

(12) United States Patent
Zur et al.

(10) Patent No.: US 12,763,281 B2
(45) Date of Patent: Oct. 13, 2026

(54) METHOD TO MORE PRECISELY CALIBRATE THE MECHANICAL TILT AND ROTATION ANGLES OF AN SEM COLUMN

(71) Applicant: APPLIED MATERIALS ISRAEL LTD., Rehovot (IL)

(72) Inventors: Yehuda Zur, Rehovot (IL); Gal Bruner, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 321 days.

(21) Appl. No.: 18/231,534

(22) Filed: Aug. 8, 2023

(65) Prior Publication Data

US 2025/0054726 A1 Feb. 13, 2025

(51) Int. Cl.

*H01J 37/22* (2006.01)
*H01J 37/147* (2006.01)
*H01J 37/28* (2006.01)

(52) U.S. Cl.

CPC ........ *H01J 37/222* (2013.01); *H01J 37/1478* (2013.01); *H01J 37/28* (2013.01); (Continued)

(58) Field of Classification Search

None

See application file for complete search history.

(56) References Cited

U.S. PATENT DOCUMENTS 6,852,974 B2 * 2/2005 Kochi .................... H01J 37/26 250/311
10,600,615 B2 3/2020 Xu et al.

(Continued)

FOREIGN PATENT DOCUMENTS

KR 20220148087 A 11/2022
KR 20230042437 A 3/2023

OTHER PUBLICATIONS

Sonn-Segev, et al., "Flow for High Resolution Stereoscopic Measurements", U.S. Appl. No. 18/131,840, Applied Materials Israel Ltd., Apr. 6, 2023, pp. 1-47.

(Continued)

*Primary Examiner* — James Choi

(74) *Attorney, Agent, or Firm* — Kilpatrick Townsend & Stockton LLP

(57) ABSTRACT

A method of determining a depth of a feature formed in a first region of a sample, by: positioning a test structure with known dimensions in a processing chamber having a charged particle column tilted at a first tilt angle and first rotational angle; determining the first tilt angle and first rotational angle by: taking an image of the test structure with the charged particle column tilted at the first tilt angle and the first rotational angle, measuring, based on the image, distances between multiple edges of the test structure aligned with each other along a vector, determining ratios between the measured distances, and determining a calculated tilt angle and a calculated rotational angle of charged particle column from the ratios and the known dimensions of the structure; transferring the test structure out of the processing chamber and positioning the sample in the processing chamber such that the first region is under a field of view of the charged particle column; taking a first image of the feature with the column tilted at the first tilt angle and first rotational angle and taking a second image of the feature with the column is tilted at a second tilt angle, different than the first tilt angle, and a second rotational angle; and using stereoscopic measurement techniques to determine the depth of the feature based on the first and second images and the calculated tilt angle and calculated rotational angle.

20 Claims, 11 Drawing Sheets

(52) U.S. Cl.
CPC .................. *H01J 2237/2815* (2013.01); *H01J 2237/2826* (2013.01)

(56) References Cited

U.S. PATENT DOCUMENTS

| | | | | |
|---|---|---|---|---|
| 11,598,633 | B2 | 3/2023 | Mairov et al. | |
| 2011/0297826 | A1* | 12/2011 | Madokoro ............. | H01J 37/28 250/307 |
| 2023/0057148 | A1 | 2/2023 | Blayvas et al. | |
| 2023/0197403 | A1 | 6/2023 | Miller et al. | |

OTHER PUBLICATIONS

Zur, "Improved Precision in Stereoscopic Measurements Using a Pre-Deposition Layer", U.S. Appl. No. 17/983,225, Applied Materials Israel Ltd., Nov. 8, 2022, pp. 1-39.
PCT/US2024/039191, "International Search Report and Written Opinion", Oct. 30, 2024, 11 pages.
PCT/US2024/039191, "International Preliminary Report on Patentability", Feb. 19, 2026, 8 pages.

* cited by examiner

METHOD TO MORE PRECISELY CALIBRATE THE MECHANICAL TILT AND ROTATION ANGLES OF AN SEM COLUMN

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen of an electronic structure such as a silicon wafer can be analyzed in a scanning electron microscope (SEM) to study a specific characteristic feature in the wafer. Such a characteristic feature may include the circuit fabricated and any defects formed during the fabrication process.

SEM imaging techniques can be used to see a surface of a region of interest (ROI) within a specimen and can also be used to see the bulk of the material within the ROI. For example, a ROI on a specimen can be bombarded with ions of Xenon, Gallium or other elements generated by a focused ion beam (FIB) column to erode the surface layer of the specimen in the ROI, thus allowing layers within the ROI below the surface, and initially covered by material above, to be imaged.

A dual column system incorporating both a scanning electron microscope and a focused ion beam (FIB) unit can produce high resolution SEM images of a localized area of an electronic structure formed on a sample, such as a semiconductor wafer. A typical dual column system includes an SEM column, an FIB column, a supporting element that supports the sample and a vacuum chamber in which the sample is placed while being milled (by the FIB column) and while being imaged (by the SEM column).

Removing one or more selected layers (or a portion of a layer) to uncover or isolate a portion of the specimen is known as delayering and can be done in a dual column system, such as that described above. For example, delayering can be done by: (i) locating a region of interest that should be milled in order to remove a certain thickness of material from the specimen, (ii) moving the sample (e.g., by a mechanical supporting element) so that the specimen is located under the FIB unit, and (iii) milling the specimen to remove a desired amount of material in the region of interest. The above steps of a delayering process can be repeated many times (e.g., tens or hundreds or thousands of times) forming a hole (sometimes referred to as a "milled box") in the specimen that is usually sized a few microns to few tens of microns in the lateral and vertical dimensions.

It is often desirable to determine the precise measurements of a feature on a sample, such as the depth of a box milled in the sample or the thickness of a buried layer within the sample. One way of determining the measurements of such features is with stereoscopic techniques used with an imaging device, such as a scanning electron microscope (SEM). For example, when a milled hole is viewed from different perspectives (i.e., different angles), the apparent depth of milled hole varies. The actual depth can then be determined using distances measured between the top surface of the sample and the bottom surface of the milled hole as viewed from the different perspectives.

While existing stereoscopic imaging techniques have been successfully used to determine the depth of milled holes, improvements in the accuracy or precision of such stereoscopic imaging techniques methods are desirable.

BRIEF SUMMARY OF THE INVENTION

Embodiments described herein provide improved methods and systems for measuring features on a sample, such as the depth of a hole milled in a sample or the thickness of a layer formed on a sample. According to some embodiments, a new and novel way to measure features using stereoscopic measurement techniques. Instead of relying on calibrated tilt and rotation angles of the SEM column for stereoscopic measurements, which in themselves rely on measurements taken at different tilt angles where it is assumed the tilt and rotation angles are known (e.g., measurements taken assuming the SEM column is tilted at a perfect 45 degree angle with 0 degrees of rotation), some embodiments rely on the projection of vectors and spherical coordinates to determine the actual tilt and rotation angles at a very high level of precision. The tilt and rotation angles can be determined (calculated) based on test structures for which the dimensions are known to a very high degree of precision, and then, the calculated values of the tilt and rotation angles can then be used when the SEM column is later employed to measure features on productions wafers using stereoscopic measurement techniques.

In some embodiments a method of determining a depth of a feature formed in a first region of a sample is provided. The method includes: positioning a test structure with known dimensions in a processing chamber having a charged particle column tilted at a first tilt angle and first rotational angle and determining the first tilt angle and first rotational angle by: taking an image of the test structure with the charged particle column tilted at the first tilt angle and the first rotational angle, measuring, based on the image, distances between multiple edges of the test structure aligned with each other along a vector, determining ratios between the measured distances, and determining a calculated tilt angle and a calculated rotational angle of charged particle column from the ratios and the known dimensions of the structure. The test structure can be transferred out of the processing chamber and the sample can be positioned in the processing chamber such that the first region is under a field of view of the charged particle column. The method then further includes: taking a first image of the feature with the column tilted at the first tilt angle and first rotational angle and taking a second image of the feature with the column is tilted at a second tilt angle, different than the first tilt angle, and a second rotational angle; and using stereoscopic measurement techniques to determine the depth of the feature based on the first and second images and the calculated tilt angle and calculated rotational angle.

In some embodiments, a method of precisely calibrating mechanical tilt and rotation angles of a charged particle column is provided. The method includes positioning a test structure with known dimensions in a processing chamber having a charged particle column tilted at a first tilt angle and first rotational angle. Then, the first tilt angle and first rotational angle can be determined by: taking an image of the test structure with the charged particle column tilted at the first tilt angle and the first rotational angle; measuring, based on the image, distances between multiple edges of the test structure aligned with each other along a vector; determining ratios between the measured distances; and determining a calculated tilt angle and a calculated rotational angle of charged particle column from the ratios and the known dimensions of the structure.

Some embodiments pertain to a system for determining a depth of a feature formed in a first region of a sample. The system can include: a vacuum chamber; a sample support configured to hold a sample within the vacuum chamber during a milling process; a charged particle beam column configured to direct a charged particle beam into the vacuum chamber; and a processor and a memory coupled to the processor. The memory can include a plurality of computer-readable instructions that, when executed by the processor, cause the system to: position a test structure with known dimensions on the sample support with the charged particle column tilted at a first tilt angle and first rotational angle and determine the first tilt angle and first rotational angle by: taking an image of the test structure with the charged particle column tilted at the first tilt angle and the first rotational angle; measuring, based on the image, distances between multiple edges of the test structure aligned with each other along a vector; determining ratios between the measured distances; and determining a calculated tilt angle and a calculated rotational angle of charged particle column from the ratios and the known dimensions of the structure. The memory can also include instructions that, when executed by the processor cause the system to transfer the test structure out of the processing chamber and position the sample in the processing chamber such that the first region is under a field of view of the charged particle column; take a first image of the feature with the column tilted at the first tilt angle and first rotational angle and taking a second image of the feature with the column is tilted at a second tilt angle, different than the first tilt angle, and a second rotational angle; and use stereoscopic measurement techniques to determine the depth of the feature based on the first and second images and the calculated tilt angle and calculated rotational angle.

In various implementations, embodiments can include one or more of the following features. The test structure can include: a first set of edges spaced apart from each other and aligned with an X-axis such that, when the first set of edges is projected onto a two dimensional space, a first vector normal to the X-axis intersects each edge in the first set; and a second set of edges spaced apart from each other and aligned with a Y-axis such that, when the second set of edges is projected onto a two dimensional space, a second vector normal to the Y-axis intersects each edge in the second set. The first set of edges can include three edges and the second set of edges can include four edges. The test structure can be a trapezoidal prism and the distances measured between multiple edges can includes a distance of a width of a top surface of the trapezoidal prism, a length of a front surface of the prism, and a length of a side surface of the prism. The first set of edges can include first, second and third edges and the second set of edges can include fourth, fifth, sixth and seventh edges. The ratios determined can include a first ratio between a distance between the first and second edges to a distance between the second and third edges and a second ratio between a distance between the fourth and fifth edges to a distance between the sixth and seventh edges. The second rotational angle can be equal to the first rotational angle. The first tilt angle can be approximately 45° to a top surface of the sample and the second tilt angle can be approximately normal to the surface of the sample. The charged particle column can be a scanning electron microscope (SEM) column. The sample can be a semiconductor wafer. The processing chamber can be a vacuum chamber that includes both a focused ion beam (FIB) column and a scanning electron microscope (SEM) column.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments described herein provide improved methods and systems for measuring the depth of a hole milled in a sample. In some embodiments, a hole is milled in a sample using a focused ion beam (FIB) as part of a sample evaluation process. Registration marks can be formed on both the top and bottom levels of the milled hole. A first set of images can then be taken of the top and bottom level registration marks at a first tilt angle and a second set of images can be taken of the top and bottom level registration marks at a second tilt angle, different than the first tilt angle.

In some embodiments, the images in the first and second sets of images can be taken with a scanning electron microscope with the field of view set such that each image captures a unique feature of its respective registration mark without including any portion of the other registration mark. That is, the images that capture the top level registration mark will not include any portion of the bottom registration mark and vice-versa. Such images can be referred to herein as “small field of view” or “small FOV” images in contrast to larger FOV images that include both registration marks in a single image. Further, in some embodiments, in each set of images, the image of the top level registration mark and image of the bottom level registration mark do not include any overlapping area of the sample.

The pixel resolution of the small FOV images captured according to embodiments disclosed herein is much higher (smaller pixels) than methods that employ a larger field of view for the images in which the registration marks on the top and bottom levels of the milled hole are captured in a single image. The two sets of small FOV images can then be used to determine the height of the milled hole as described herein with a very high degree of accuracy.

While embodiments of the disclosure can be used to perform measurements on a holes milled into a variety of different types of samples, some embodiments are particularly useful in performing measurements on samples that are semiconductor wafers or similar specimens.

DEFINITIONS

As used herein, the terms "hole" and "box" can refer generically to a box, a trench or other structure milled into a sample where one or more surfaces of the hole are below the original surface of the sample prior to the milling operation.

The "Z-axis" is the vertical axis, the "X-axis" is the axis such that a perfectly calibrated column is tilted along the XZ plane, and the "Y-axis" is at a 90 degree angle to the X-axis and the Z-axis.

Additionally, the "tilt angle" of the SEM column represents the angle between the SEM column and the Z-axis and the "rotation angle" of the SEM column represent the angle between the column and the XZ-plane.

Example Sample Evaluation Tool

Figure 1A:
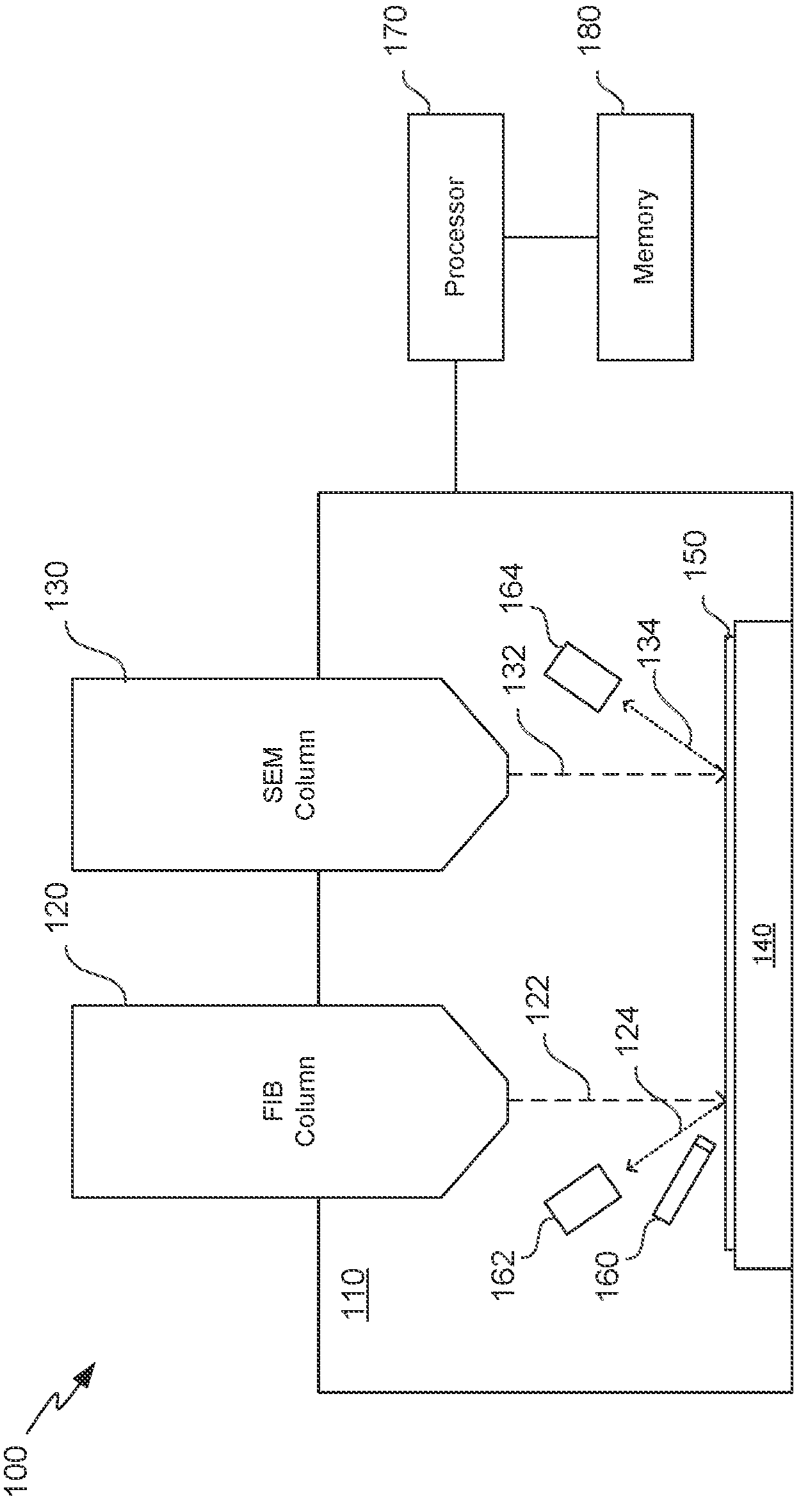
FIG. 1A is a simplified illustration of a sample evaluation system according to some embodiments of the disclosure.

In order to better understand and appreciate the disclosure, reference is first made to FIG. 1A, which is a simplified schematic illustration of a sample evaluation system 100 in accordance to some embodiments of the disclosure. Sample evaluation system 100 can be used for, among other operations, defect review and analysis of structures formed on samples such as semiconductor wafers.

As shown in FIG. 1A, sample evaluation system 100 can include, among other elements, a vacuum chamber 110, a focused ion beam (FIB) column 120, a scanning electron microscope (SEM) column 130, a sample supporting element 140, a gas injection nozzle 160 and, optionally, secondary electron detectors 162, 164 (or in some embodiments, secondary ion detectors, or a combination of the two detectors working in parallel). FIB column 120 and SEM column 130 are connected to vacuum chamber 110 so that a charged particle beam generated by either one of the charged particle columns propagates through a vacuumed environment formed within vacuum chamber 110 before impinging on sample 150. For example, FIB column 120 is operable to generate a charged particle beam 122 and direct the charged particle beam 122 towards a sample 150 (sometimes referred to herein as an "object" or a "specimen") to mill or otherwise process the sample. SEM column 130 can generate an image of a portion of sample 150 by illuminating the sample with a charged particle beam 132, detecting particles emitted due to the illumination, and generating charged particle images based on the detected particles.

The sample 150, for example a semiconductor wafer, can be supported on the sample supporting element 140 within vacuum chamber 110. Sample supporting element 140 can also move regions of the sample within vacuum chamber 110 between the field of view of the two charged particle columns 120 and 130 as required for processing. For example, the FIB column 120 can be used to mill a region on the sample 150 and the supporting element 140 can then move the sample so that the SEM column 130 can image the milled region of the sample 150.

FIB column 120 can mill (e.g., drill a hole in) sample 150 by irradiating the sample with one or more charged particle beams to form a cross section or a hole. An FIB milling process typically operates by positioning the specimen in a vacuum chamber 110 and emitting a beam of ions towards the specimen to etch or mill away material on the specimen. Common milling processes form a cross section of the sample 150 and, if desired, can also smooth the cross section. In some instances, the vacuum environment can be purged with background gases that serve to control the etch speed and other parameters. The accelerated ions can be generated from Xenon, Gallium or other appropriate elements and are typically accelerated towards the specimen by voltages in the range of 500 volts to 100,000 volts, and more, typically falling in the range of 3,000 volts to 30,000 volts. The beam current is typically in the range from several pico amps to several micro amps, depending on the FIB instrument configuration and the particular application, and the pressure is typically controlled between $10^{-10}$ to $10^{-5}$ mbar in different parts of the system and in different operation modes.

During a milling operation, the charged particle beam 122 generated by the FIB column 120 propagates through a vacuum environment formed within vacuum chamber 110 before impinging on the sample 150. Secondary electrons and ions 124 are generated in the collision of ions with the sample and can be detected by the detector 162. The detected secondary electrons or ions 124 can be used to analyze characteristics of the milled layers and the structure, can be used to determine an endpoint of a milling process, and/or can be used to form an images.

During a particle imaging operation, the charged particle beam 132 generated by the SEM column 130 propagates through the vacuum environment formed within the vacuum chamber 110 before impinging on the sample 150. Secondary electrons 134 are generated in the collision of electrons with the sample 150 and can be detected by the detector 164. The detected secondary electrons 134 can be used to form images of the milled area and/or to analyze characteristics of the milled layers and the structure.

Particle imaging and milling processes each typically include scanning a charged particle beam back-and-forth (e.g., in a raster scan pattern) at a constant rate across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

During some processing operations, one or more gases can be delivered into chamber 110 by a gas injection system 160. For simplicity of explanation gas injection system 160 is illustrated in FIG. 1A as a nozzle, but it is noted that gas injection system 160 can include gas reservoirs, gas sources, valves, one or more inlets and one or more outlets, among other elements. In some embodiments gas injection system 160 can be configured to deliver gas to a localized area of sample 150 that is exposed to the charged particle beam as opposed to delivering gas to an entire upper surface of the sample. For example, in some embodiments gas injection system 160 has a nozzle diameter measured in hundreds of microns (e.g., between 400-500 microns) that is configured to deliver gas directly to a relatively small portion of the sample's surface that encompasses the charged particle beam scan pattern or collision zone. In various embodiments, a first gas injection system 160 can be configured to deliver gas to a sample disposed under FIB column 120 and a second gas injection system 160 (not shown) can be configured to deliver gas to a sample disposed under SEM column 130.

As shown in FIG. 1A, system 100 can include one or more controllers, processors, or other hardware units 170 that control the operation of system 100 by executing computer instructions stored in one or more computer-readable memories 180 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Figure 1B:
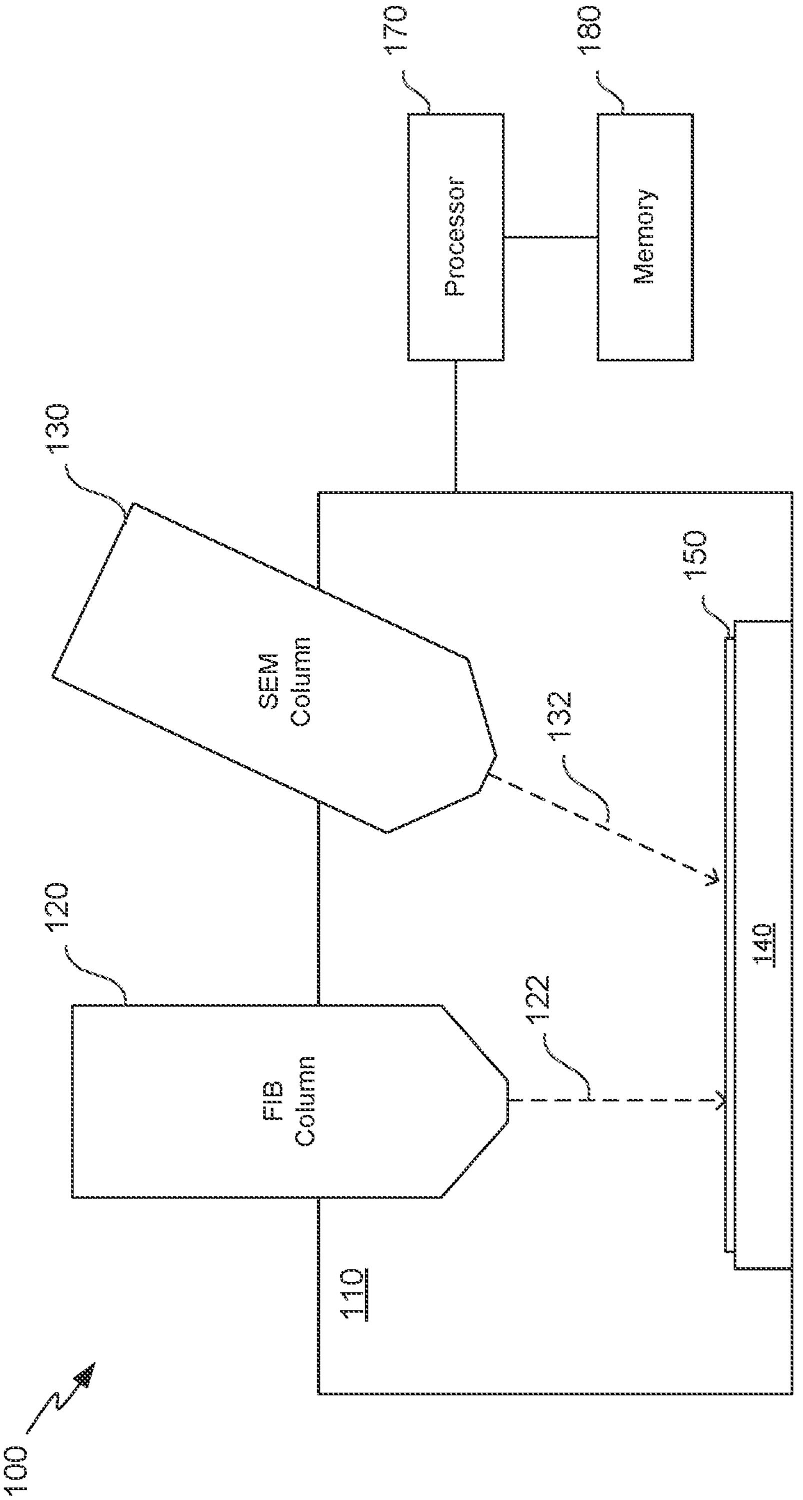
FIG. 1B is simplified illustration of a sample evaluation system shown in FIG. 1A with the SEM column tilted according to some embodiments.

FIG. 1B shows the substrate inspection system 100 with the SEM column 130 tilted. As explained more fully below, SEM column 130 can be tilted relative to a surface of the sample 150 to obtain images from different angles relative to a surface of sample 150 (or from different perspectives). In some embodiments, when SEM column 130 is tilted, the tilting process does not involve a linear motion in which the column is tilted along a single plane. Instead, the motion can be a three-dimensional motion in which the tilting occurs by both tilting and rotating the SEM column (e.g., as in a helix or downward/upward spiral motion) thus altering both the tilt angle and the rotational angle of the column with respect to the sample. Alternatively, in some embodiments, instead of tilting the SEM column, the supporting element 140 can be configured to tilt the sample 150 so that images can be obtained from different angles. Gas nozzle 160 and detectors 162, 164 are not shown in FIG. 1B for ease of illustration.

The inspection system 100 shown in FIGS. 1A and 1B is provided as an example of a system that can be used with some of the embodiments described herein. It should be appreciated that the embodiments are not limited to the inspection system 100, and other inspection systems can be used with some embodiments. Also, in some embodiments, an FIB tool can be used to mill a hole in a sample, and a separate SEM tool can be used to obtain images of the hole.

General Concepts—Stereoscopic Measurements with an SEM Instrument

Stereoscopic techniques can be used with an imaging device, such as scanning electron microscope column 130, to determine the thickness or depth of different structures formed on a sample. One technique for doing such is described in commonly assigned U.S. patent application Ser. No. 17/983,225 filed on Nov. 8, 2022, and entitled “Improved Precision in Stereoscopic Measurements using a Pre-Deposition Layer”. But, for the sake of convenience, a brief description of the stereoscopic measurement technique described in the Ser. No. 17/983,225 application as applied to determining the depth of a milled hole is presented below with reference to FIGS. 2A-3B.

Figure 2A:
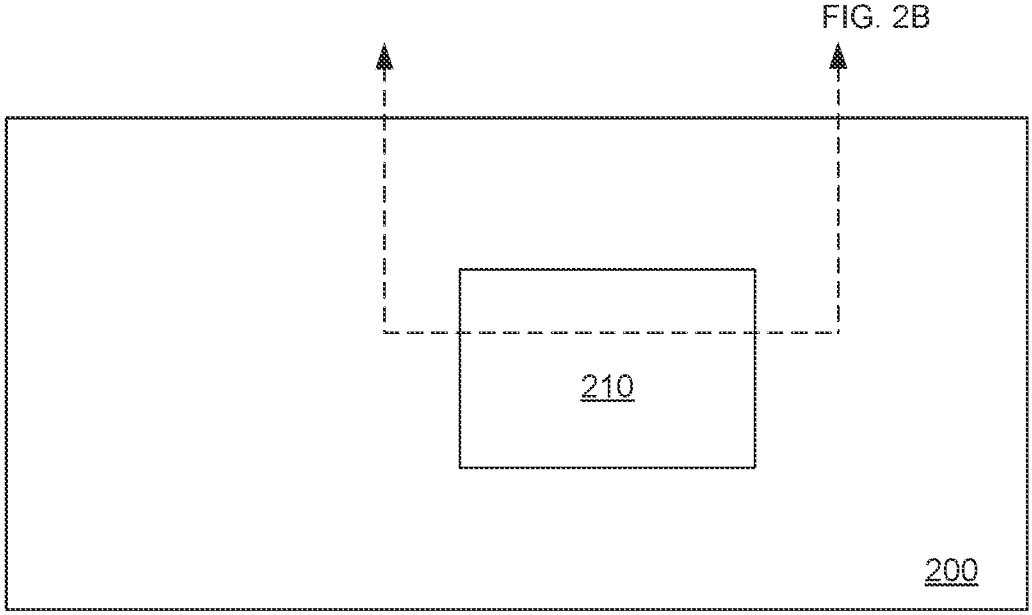
FIG. 2A is a simplified top-down view of a sample having a milled box.
Figure 2B:
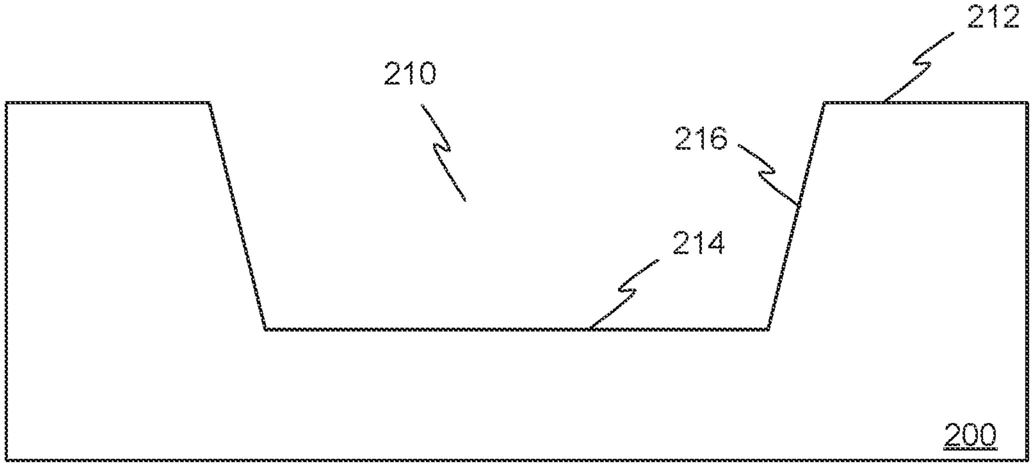
FIG. 2B is a simplified cross-sectional view of a portion of the sample shown in FIG. 2A.

Shown in FIGS. 2A and 2B are simplified top-down and cross-sectional views, respectively, of an example hole 210 (sometimes referred to herein as “box 200”) that has been milled in a sample 200. As shown in FIG. 2B, the depicted box 210 includes sidewalls 216 formed between an upper surface 212 of sample 200 and a lower surface 214 of the box. Stereoscopic imaging techniques discussed below can be used to determine the depth (height) of box 210, i.e., the distance between upper surface 212 and lower surface 214.

When box 210 is viewed from different perspectives, the apparent depth of the box, as indicated by a distance between top surface (level) 212 and bottom surface (level) 214 varies. More specifically, an apparent distance between the top and bottom surfaces 212, 214 of the box 210 increases as a tilt angle increases, reaching a maximum at a particular tilt angle that depends on the slope of sidewall 216, and then decreases with further increases in the tilt angle.

Figure 3A:
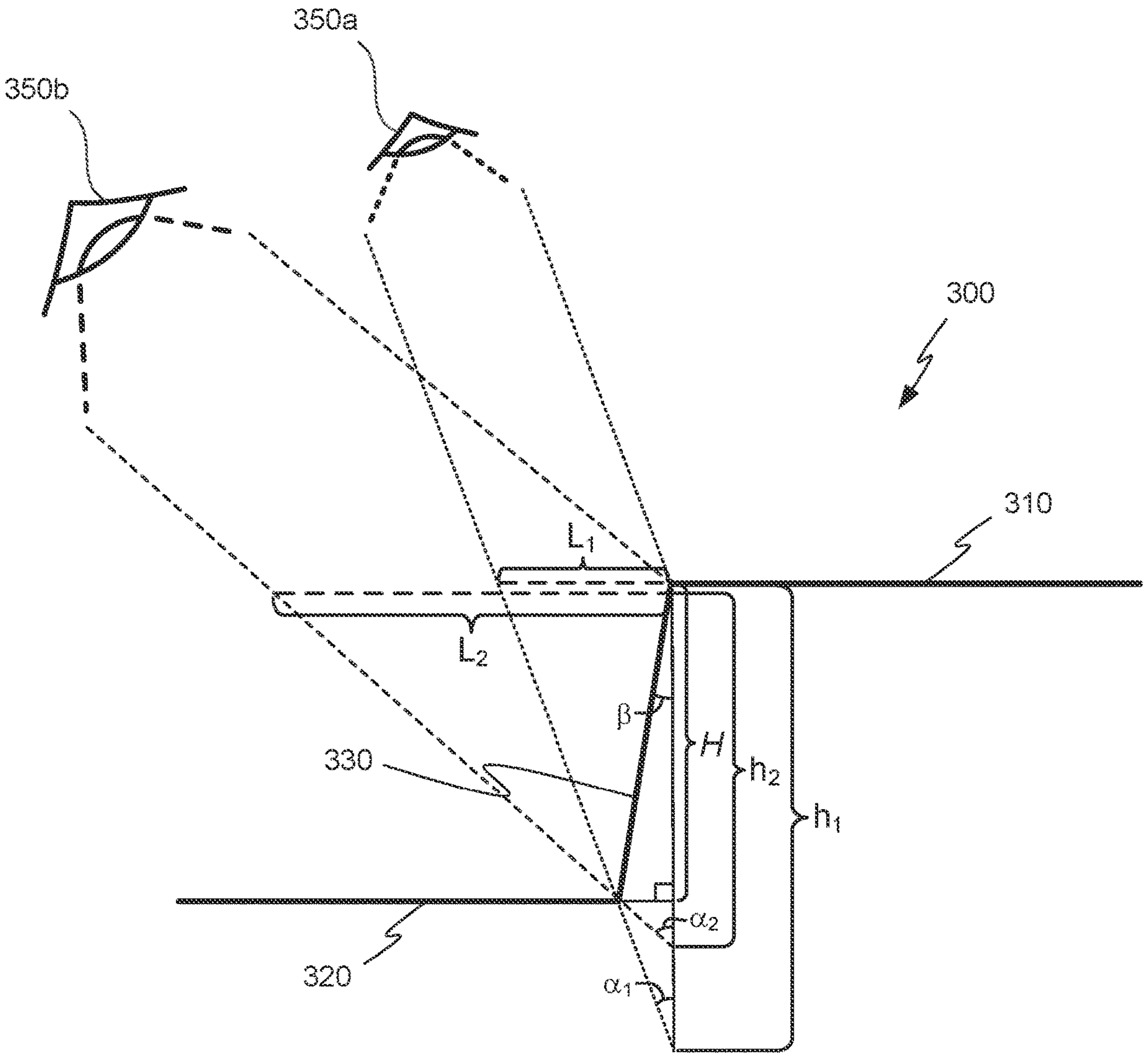
FIG. 3A is a simplified diagram illustrating how a vertical depth of a structure, such as the milled box shown in FIGS. 2A and 2B, can be determined using stereoscopic imaging techniques.

The depth or height of box 210 (a vertical distance) can be determined using distances measured between the top and bottom surfaces of the box as viewed from different perspectives. FIG. 3A is a simplified diagram illustrating how a vertical depth of a structure 300 (such as box 210) can be determined using stereoscopic imaging techniques. For ease of illustration, upper and lower surfaces of the structure 300 layer are represented in this figure by horizontal lines 310, 320, respectively. The horizontal lines are connected by a line 330 representing the sidewall of the structure 300, which in this particular example is sloped at an angle β from the vertical. While sidewall 330 is shown in FIG. 3A as having an angled slope, in some instances sidewall 330 will be completely normal, or almost completely normal, to upper and lower surfaces 212, 214 such that β=0.

In this example, a first image of the sidewall is obtained from a first perspective 350*a* at a first tilt angle $\alpha_1$, and a second image is obtained from a second perspective 350*b* at a second tilt angle $\alpha_2$. The tilt angles $\alpha_1$ and $\alpha_2$ can be user defined and/or can be obtained from or determined by the imaging device. The vertical height or depth of the structure 300 is represented by H.

When analyzing features from a titled perspective, most conventional SEM imaging devices measure distance projected onto a horizontal or vertical plane. As an example, in FIG. 3A the distance projected onto the horizontal plane from the first perspective 350*a* is $L_1$, and the distance projected onto the vertical plane from the first perspective is $h_1$. Similarly, the distance projected onto the horizontal plane from the second perspective 350*b* is $L_2$, and the distance projected onto the vertical plane from the second perspective is $h_2$. In accordance with some embodiments, these measured distances can be used along with the tilt angles $\alpha_1$ and $\alpha_2$ to determine the vertical height H of structure 300 using either of the following equations:

$$H = \frac{L2 - L1}{\tan(\alpha 2) - \tan(\alpha 1)}$$

$$H = \frac{h2\tan(a2) - h1\tan(\alpha 1)}{\tan(\alpha 2) - \tan(\alpha 1)}$$

Figure 3B:
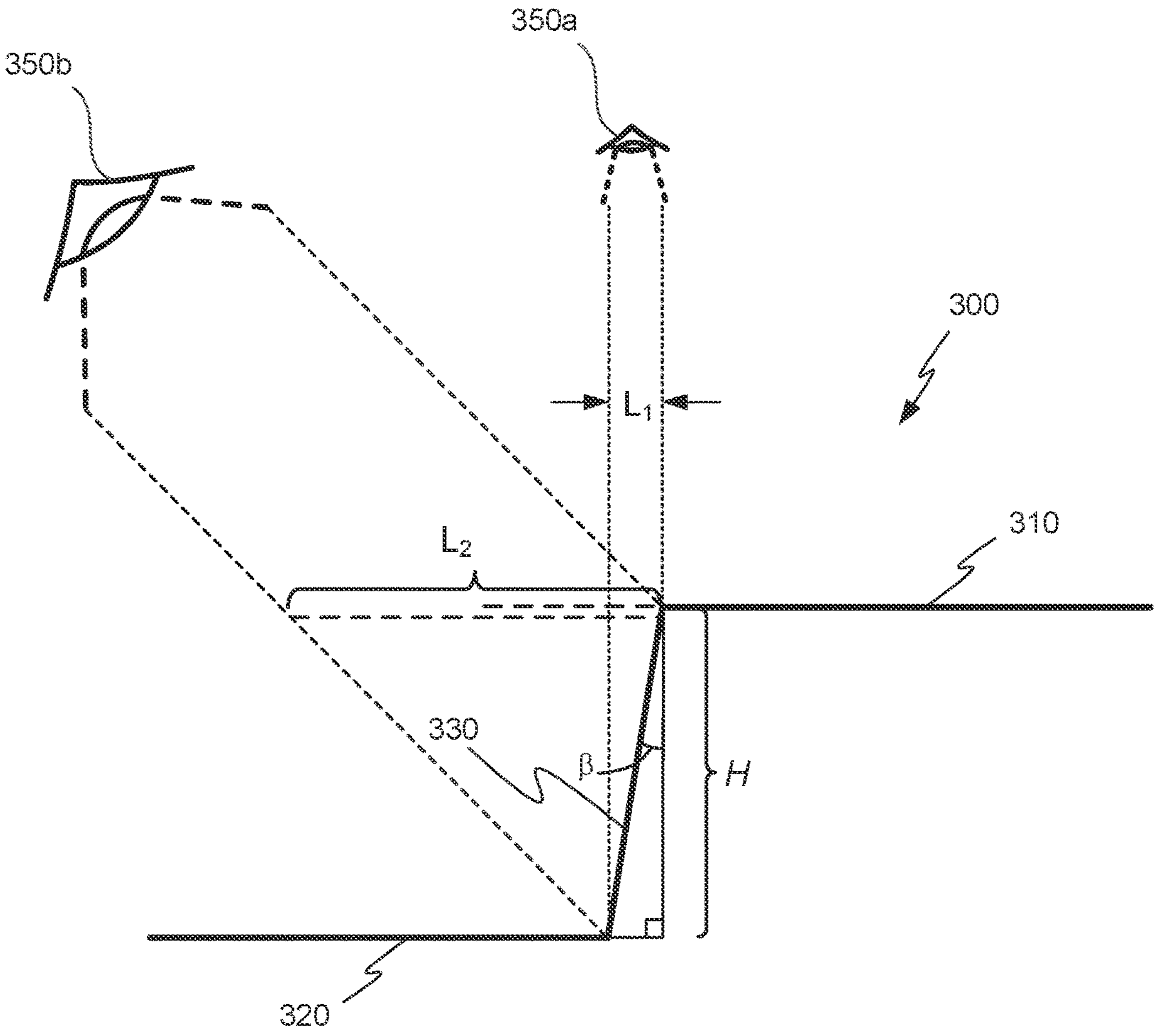
FIG. 3B is a simplified diagram illustrating how a vertical depth of a structure, such as the milled box shown in FIGS. 2A and 2B, can be determined using stereoscopic imaging techniques with images taken at 0 and 45 degrees, respectively.

In some instances, the first perspective 350*a* can be approximately top-down (normal to a surface of the sample), and the second perspective 350*b* can be approximately 45° to the surface of the sample. In such a configuration, which is depicted in FIG. 3B, the vertical height H of structure 300 layer can be simplified and determined using the equation:

$$H = L2 - L1$$

In addition to the above, it is also important to know the rotation angle of the SEM column when measurements are taken at any angle other than top down (e.g., a tilt of 0 degrees).

The Importance of the Tilt and Rotation Angles in Measuring Features

As is evident to a skilled artisan, the accuracy of measurements of a feature using stereoscopic techniques described above depends, in part, on the precision at which the tilt and rotation angles of the SEM column are known when the measurements are taken at the different perspectives. In some previously known stereoscopic measurement processes, the tilt and rotation angles for such measurements have been determined based on an SEM tool calibration process that requires a magnification level, which sets a ratio of pixel-to-distance for the SEM image, as an input. The magnification level itself, however, is determined by relying on measurements taken at different tilt angles where it is assumed the tilt and rotation angles are known (e.g., measurements taken assuming the SEM column is tilted at a perfect 45 degree angle with 0 degrees of rotation). If the actual tilt of the SEM column is not precisely 45 degrees or precisely 0 degrees, the magnification level used in the calibration process is inaccurate thus leading to inaccuracies in the calibration process. Thus, said differently, the calibration process in such previously known techniques relies on measurements taken at different tilt and rotation angles where it is assumed those tilt and rotation angles are precisely known when such is not precisely known. Additionally, even more potentially problematic is measuring a tilted feature while the tilt view was calibrated on a surface feature.

Stereoscopic Measurement Techniques According to Some Embodiments Disclosed Herein Embodiments disclosed herein provide a new and novel way to measure features using stereoscopic measurement techniques without the need to use exact measurements in the later estimate of the angles, therefore eliminating the assumption of perfect angles. Instead of relying on calibrated tilt and rotation angles of the SEM column for stereoscopic measurements, embodiments rely on the projection of vectors and spherical coordinates as described below to determine the actual tilt and rotation angles at a very high level of precision.

The techniques described below can be performed on one or more test structures prior to the measurement of features on production wafers and the tilt and rotation angles determined by the process can then be used when the SEM column is later employed to measure features on productions wafers. The dimensions of the test structures should be known to a very high degree of precision. Dimensions of the test structure can be determined in any appropriate manner. As non-limiting examples, in some embodiments the test structures can be measured with an atomic force microscope (AFM), in other embodiments the test structures can be supplied by a third party who also supplies the precise dimensions of the test structure along with the structures themselves.

Figure 4A:
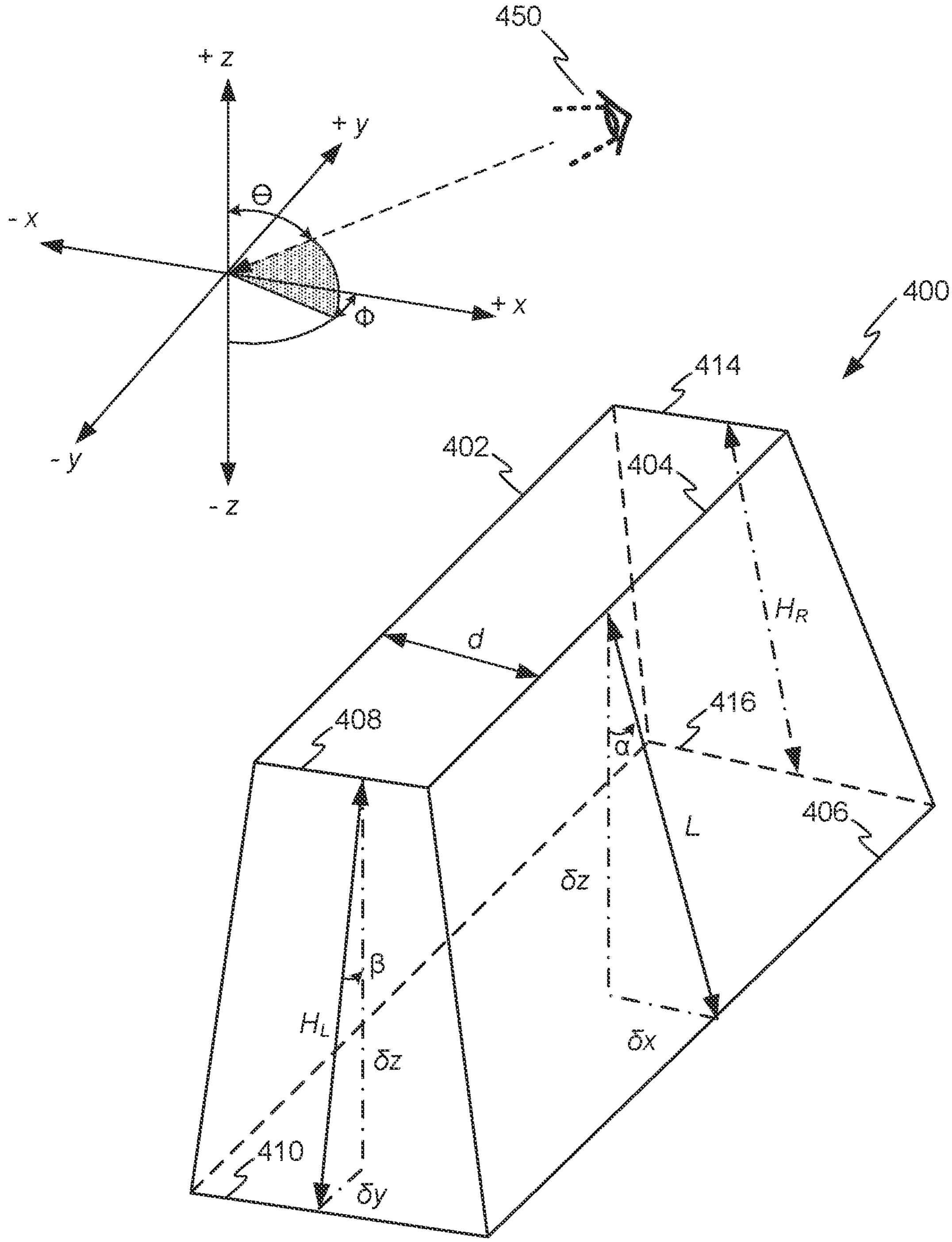
FIG. 4A is a simplified perspective view illustration of a test structure in accordance with some embodiments.
Figure 4B:
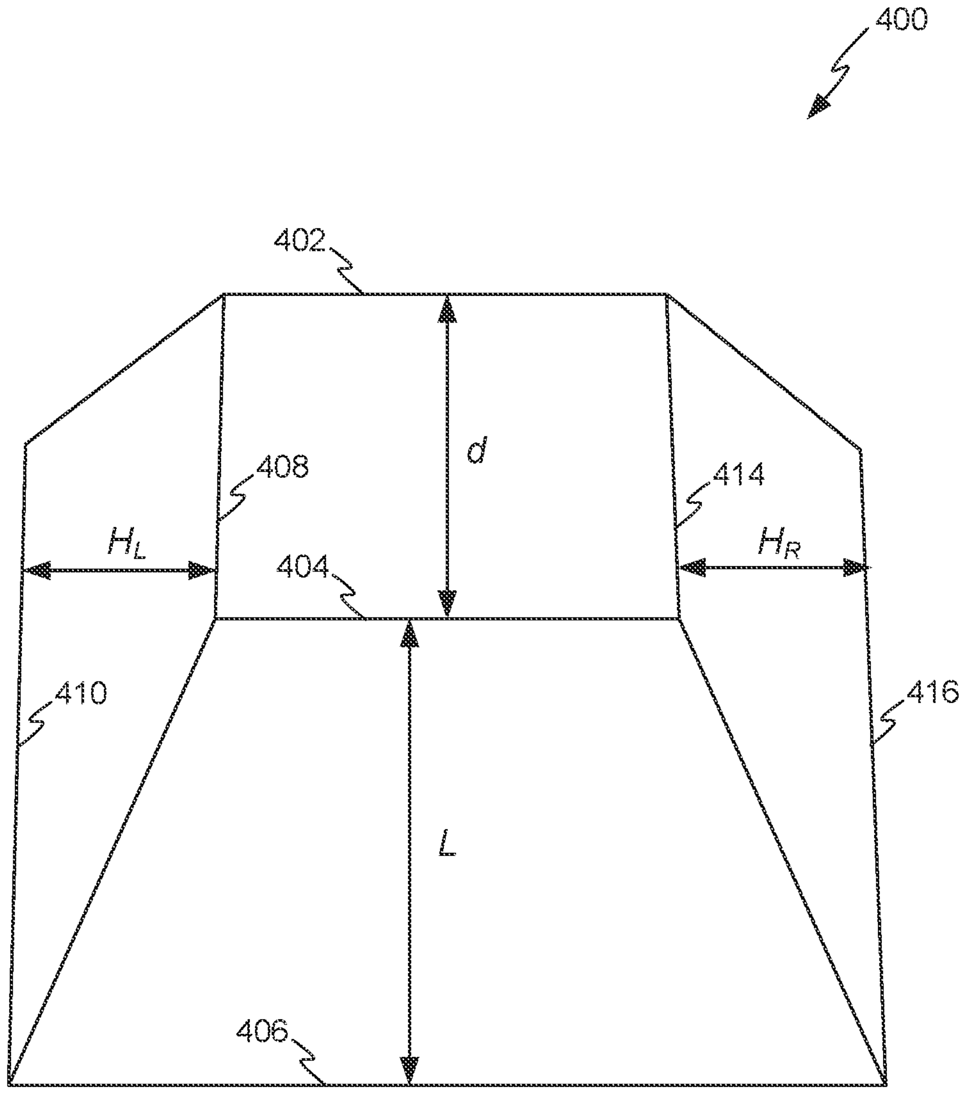
FIG. 4B is a simplified illustration of the test structure shown in FIG. 4A when viewed from a 45 degree angle.
Figure 5:
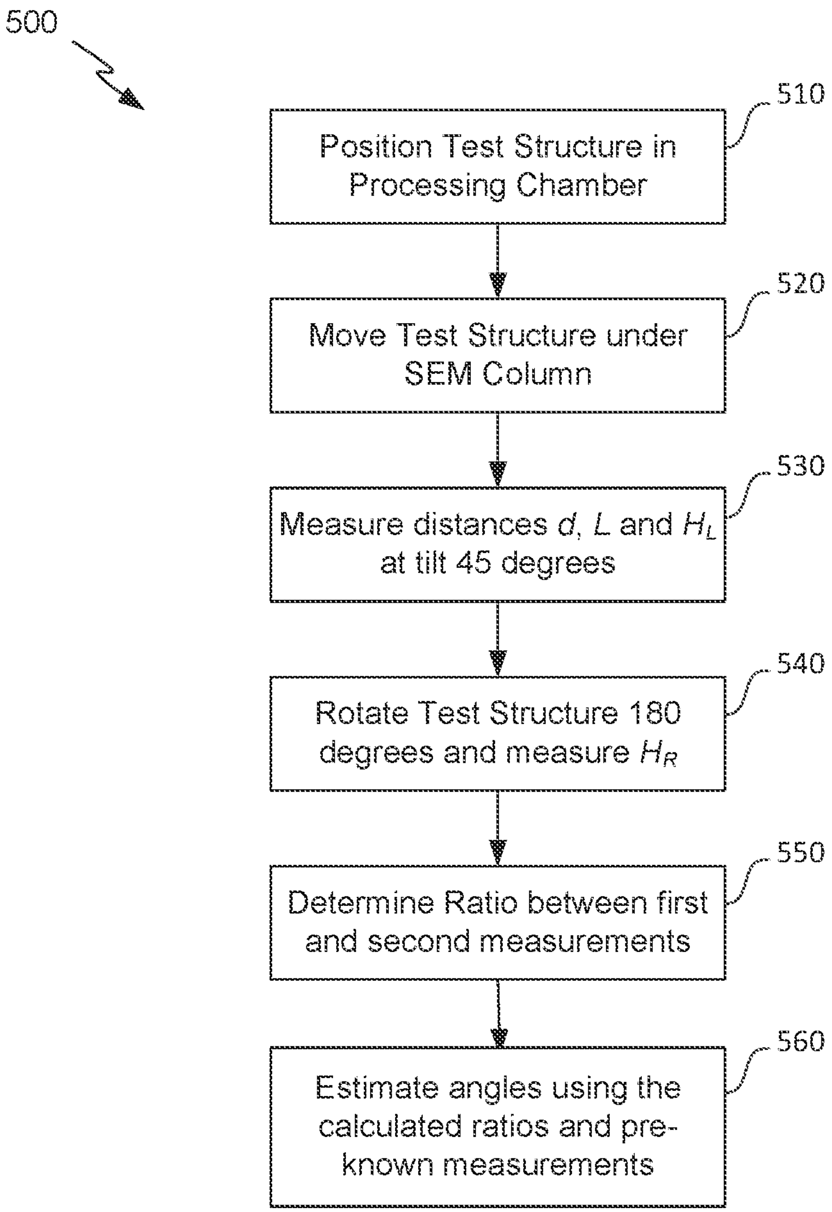
FIG. 5 is a flowchart depicting steps associated with a method according some embodiments.

To illustrate how tilt and rotation angles of an SEM column can be precisely determined according to embodiments, reference is made to FIGS. 4A, 4B and 5. FIG. 4A is a simplified perspective view illustration of a test structure 400 in accordance with some embodiments, FIG. 4B is a simplified illustration of the test structure shown in FIG. 4A when viewed from a 45 degree angle, and FIG. 5 is a simplified flow chart depicting a method according to some embodiments. As shown in FIG. 4A, test structure 400 is a trapezoidal prism with the length of the test structure aligned along the Y-axis such that edges 402, 404 and 406 are parallel with the Y-axis. It is to be understood that structure 400 is depicted for illustrative purposes only and embodiments are not limited to using test structures of any particular shape. Optionally, test structure 400 can be formed on a substrate, such as a semiconductor wafer, to facilitate transfer of the test structure into and out of the vacuum chamber associated with the SEM column.

The trapezoidal prism test structure 400 has an upper surface with a width of d (the distance between edges 402 and 404), a height of δz, and an offset between the edge of the upper surface and lower surface of δx. As stated above, each of these dimensions should be known prior to the start of method 500.

In order to determine the precise angles at which an SEM column is tilted and rotated, embodiments position test structure 400 within the evaluation tool that includes the SEM column (block 510) and move the test structure under the field of view of the SEM column (block 520) with the SEM column tilted at 45 degrees. In the discussion below, it is assumed that stereoscopic measurements of features on sample wafers will be taken with the SEM column at 0 degrees and 45 degrees. Thus, the measurements taken in following steps are performed from an SEM image taken at 45 degrees, which is indicated in FIG. 4A as perspective 450 (with a tilt angle Θ) at an assumed rotation angle Φ of 0 degrees. FIG. 4B depicts a simplified illustration of test structure 400 when viewed from perspective 450. It is to be understood, however, that embodiments are not limited to these precise tilt angles and any two angles in which the SEM column can be positioned can be precisely determined using the techniques described herein and then used in stereoscopic measurements of features as described herein. Based on the disclosure herein, a person of skill in the art can, adjust the formulas set forth herein for different sets of two angles.

Next, in block 530, an SEM image of the test structure is taken at the tilted angle (45 degrees) and measurements are made of three different distances in the image: distance d (the width of the upper surface of the prism, determined by the distance between edges 402 and 404), L (the length of the front surface of the prism, determined by the distance between edges 404 and 406) and $H_L$ (the length of the side surface of the prism, determined by the distance between edges 408 and 410). In some embodiments, $H_R$ is also measure in block 530. In other embodiments, the test structure can then be rotated 180 degrees and a second SEM image of $H_L$ can be taken from the position in which $H_R$ (the distance between edges 412 and 414) was previously located (block 540).

The following two ratios squared for Θ and Φ can then be calculated based on the measurements taken in block 530 (block 550):

$$R_\theta = \left(\frac{d}{L}\right)^2,\ R_\varphi = \left(\frac{h_l}{h_r}\right)^2$$

The two ratios calculated in the manner described above are not dependent on the magnification calibration. Thus, using the measurements taken in block 530 (and other known feature sizes and angles of the test structure) eliminates the magnification factor from the calculations to determine the tilt and rotation angles of the SEM column.

Next, since δx, δy, δz, α, β are all previously known from the test structure (for example, provided by the supplier of the test structure or measured exactly from a top-down perspective with the angles calculated), the angles (in radians) can be estimated using the calculated ratios and the pre-known values:

$$\delta\theta = \frac{d^2 - R_\theta(\delta z + \delta x)^2}{2d^2 + 2R_\theta(\delta z^2 - \delta x^2)}$$

$$\varphi = \frac{(1 - R_\varphi)(sin^2\beta - 4\delta\theta)}{(1 + R_\varphi)\sin 2\beta}$$

where the d used in the ratio is the measured d, while the d used in the angle estimation is the pre-known value. For reference, the math behind the formulas above is presented near the end of the present disclosure in the Section entitled Formulas.

Measuring Features of a Sample

Embodiments described herein can use the increased accuracy of the tilt and rotation angles determined from one or more sample wafers using the techniques described above to measure the dimensions of features on a sample, such as the depth of a milled box or the height of an exposed buried layer, with increased accuracy.

Figure 6:
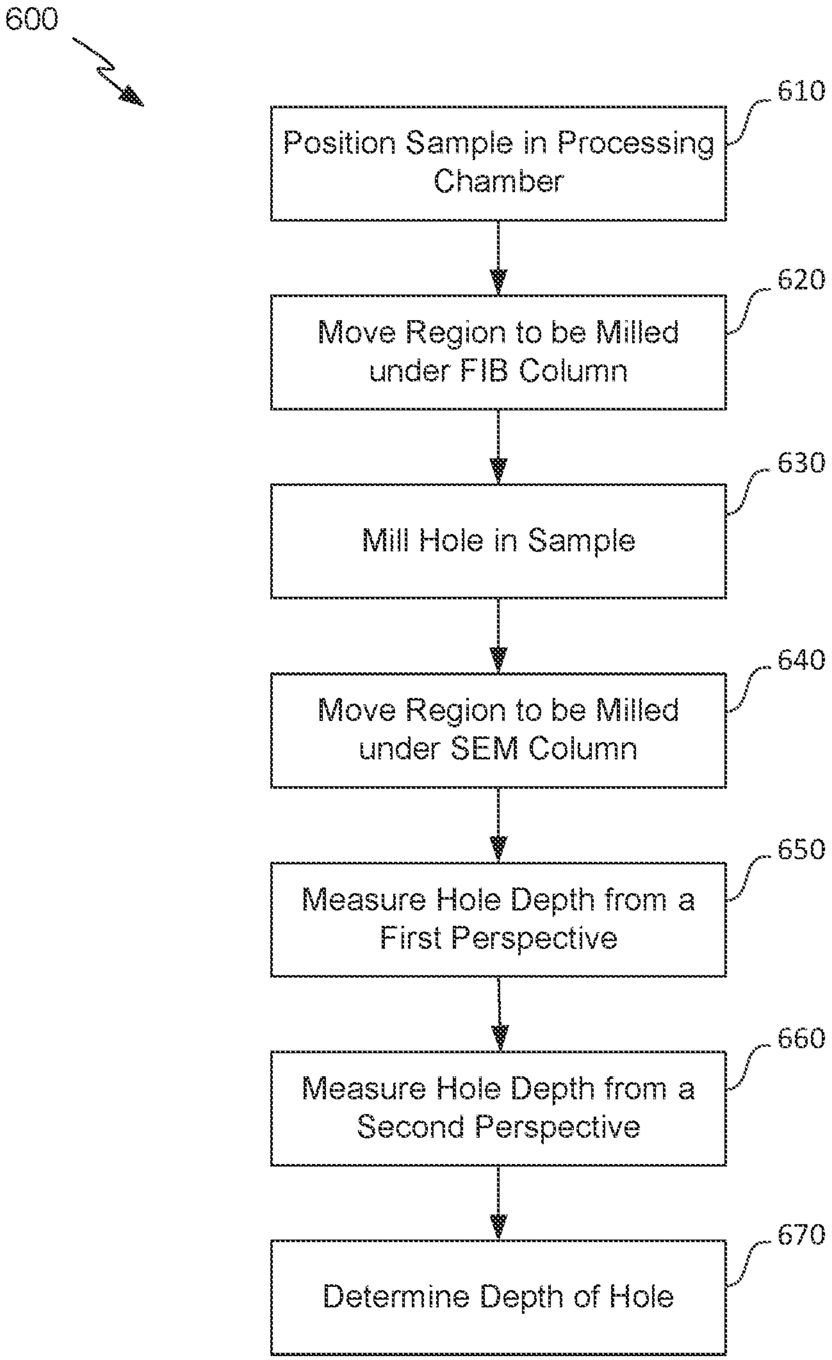
FIG. 6 is a flowchart depicting steps associated with a method according some embodiments.

To illustrate, reference is made to FIG. 6, which is a flowchart depicting steps associated with a method 600 according some embodiments disclosed herein. As shown in FIG. 6, method 600 starts by positioning a sample (e.g., a production wafer having one or more features that are to be accurately measured) on a sample support in a chamber of an appropriate evaluation system (block 610). For example, in some embodiments, step 610 includes positioning a sample, such as a semiconductor wafer, on sample support 140 within vacuum chamber 110 of sample evaluation system 100. The sample can be representative of any of samples 150, 200 or 300 discussed above.

The sample can then be moved under the field of view of the focused ion beam column (block 620), and a box can be milled (block 630) in an upper surface of the sample. The milling process can scan the focused ion beam across a region of interest (i.e., the area that includes the feature to be measured) many hundreds or thousands of times as described above.

Once the box is milled, the sample can be moved such that the region of interest is under the field of view of the SEM column (block 640). Next, the top and bottom surfaces of the box can be identified and the depth of the box can be measured from a first perspective (block 650) and a second perspective (block 660). Once these two measurements have been made, the depth of the box can be determined using the first distance, the first angle associated with the first perspective, the second distance, and the second angle associated with the second perspective as discussed above with respect to FIGS. 3A and 3B (block 670).

Example of a Sample to be Milled and Measured

Figure 7:
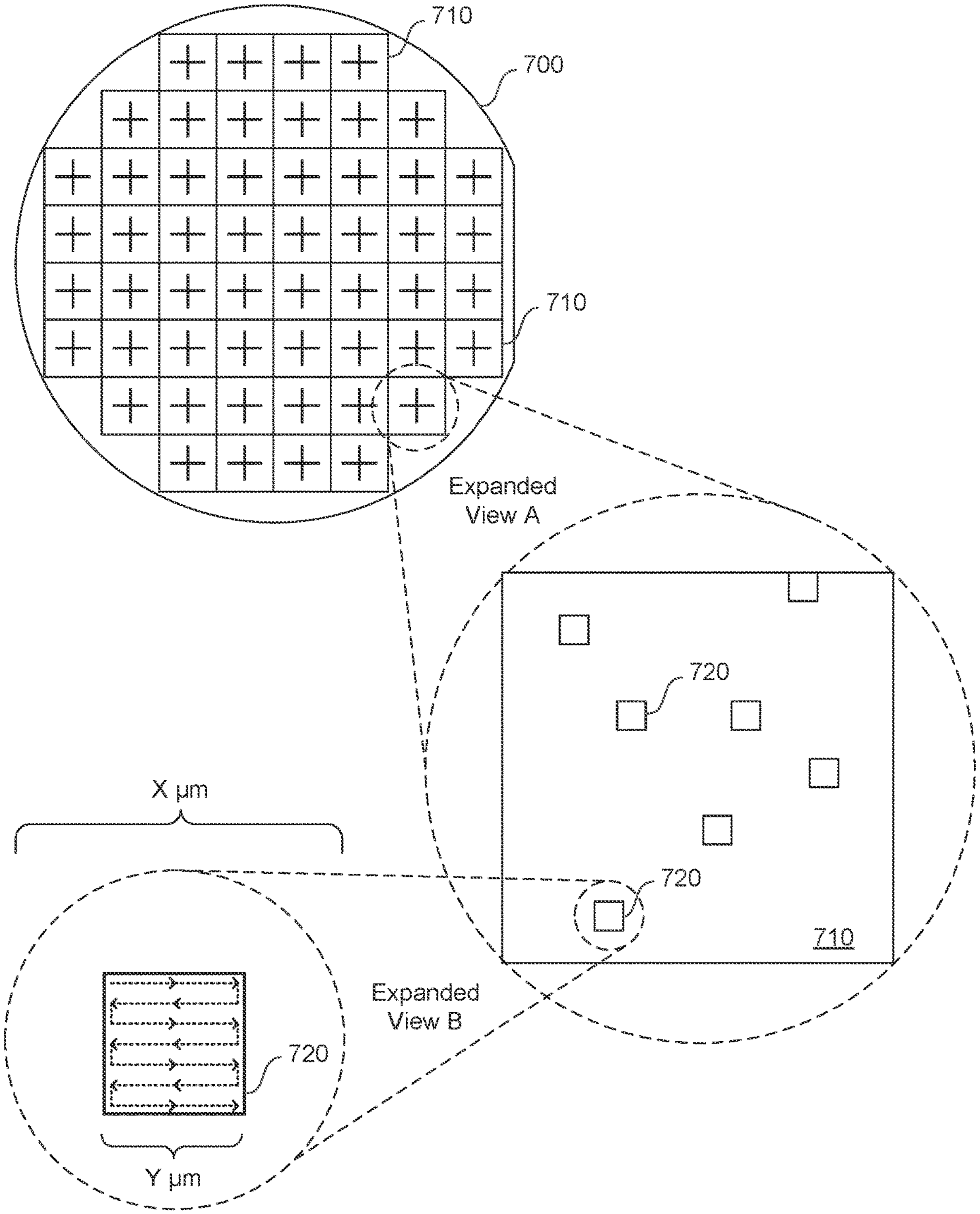
FIG. 7 is a simplified illustration of an area on a semiconductor wafer that can be include a feature that can be measured in accordance with embodiments described herein.

As stated above, embodiments of the disclosure can be used to accurately determine measurements of features formed on a sample, such as the depth of a box or hole milled in a sample or the thickness of a buried layer within the sample. Embodiments can be used to determine the measurements of such features within many different types of samples including electronic circuits formed on semiconductor structures, solar cells formed on a polycrystalline or other substrate, nanostructures formed on various substrates and the like. As one non-limiting example, FIG. 7 is a simplified illustration of an area on a semiconductor wafer that can be include a milled hole that can have its depth determined according to embodiments described herein. Specifically, FIG. 7 includes a top view of wafer 700 along with two expanded views of specific portions of wafer 700. Wafer 700 can be, for example, a 150 mm, 200 mm or 300 mm semiconductor wafer and can include multiple integrated circuits 710 (fifty two in the example depicted) formed thereon. The integrated circuits 710 can be at an intermediate stage of fabrication and the techniques described herein can be used to evaluate and analyze one or more regions 720 of the integrated circuits.

Embodiments of the disclosure can analyze and evaluate region 720 by sequentially milling away material within the region forming a milled hole. The depth of the milled hole can then be accurately determined as described above. When milling the hole, the milling process can mill region 720 by scanning the FIB back and forth within the region according to a raster pattern until the hole has been milled to a desired depth. The techniques described herein can then be used to determine the depth of the milled hole with a very high degree of accuracy.

Formulas

The formula presented above to calculate the angles Θ and Φ, which represent the tilt angle and rotational angle of the SEM column, can be derived in accordance with the following principles. In the discussion below, it is assumed that stereoscopic measurements of features on sample wafers will be taken with the SEM column at 0 and 45 degrees. It is to be understood, however, that embodiments are not limited to these precise tilt angles and any two angles in which the SEM column can be positioned can be precisely determined using the techniques described above and then used in stereoscopic measurements of features as described herein.

1. Projection of Vectors and Spherical Coordinates

Figure 8A:
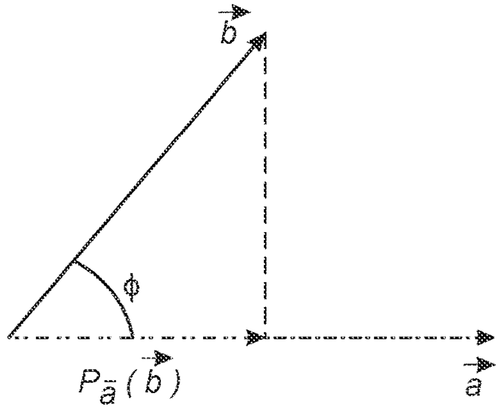
FIGS. 8A to 8C are simplified illustrations depicting various vectors and angles that can be referred to in calculations disclosed herein.

Referring first to FIG. 8A, the length of the projection of a vector $\vec{b}$ on vector $\vec{a}$ can be represented by:

$$|P_a(\vec{b})| = |b|\cos\emptyset$$

where Ø is the angle between the vectors.

Figure 8B:
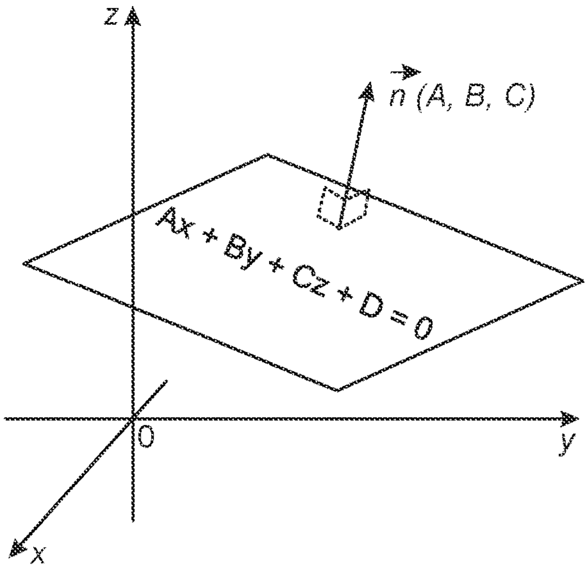
Figure 8C:
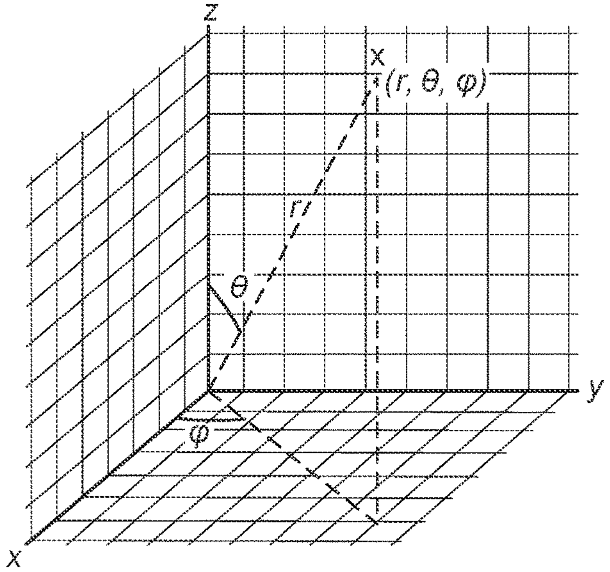

From the above and referring to FIGS. 8B and 8C, one can find the length of any vector $\vec{b}$ on any plane defined by its normal n̂, with angle Ø between the vector and the normal:

$$|P_n(\vec{b})| = |b|\sin\emptyset$$

since the normal is perpendicular to the plane.

If one takes an arbitrary vector $\vec{v}$=(x, y, z) in 3D space, and projects the vector on a plane defined by its normal vector in spherical coordinates, n̂=(sin θ cos φ, sin θ sin φ, cos θ), we get the length:

$$P_{\theta,\varphi}(\vec{v}) = |v|\sin\left(\cos^{-1}\left(\frac{x\sin\theta\cos\varphi + y\sin\theta\sin\varphi + z\cos\theta}{|v|}\right)\right) = \sqrt{|v|^2 - (x\sin\theta\cos\varphi + y\sin\theta\sin\varphi + z\cos\theta)^2}$$

where we used the vector inner-product formula to get the angle between the vector and the normal.

2. Measured Length of Vectors from View Angles

For the purposes of stereoscopic measurements herein, the view angles (depicted in FIG. 4A as view angle 450) of the SEM column can be defined such that the tilt angle is θ (θ=0 is top-down view) and the rotation angle is φ (where φ=0 is the rotation at a tilt angle of 45 degrees). The apparent length of a given vector $\vec{v}$=(x, y, z) from an arbitrary view is then the projection of that vector on a plane perpendicular to the viewing direction as calculated by:

$$P_{\theta,\varphi}(\vec{v}) = \sqrt{|v|^2 - (x\sin\theta\cos\varphi + y\sin\theta\sin\varphi + z\cos\theta)^2}$$

For the vector $\vec{L}$=(−δx, 0, δz), (refer to FIG. 4A), a nearly-vertical wall parallel to the y-axis can be calculated by:

$$P_{\theta,\varphi}(\vec{L}) = \sqrt{L^2 - (\delta z\cos\theta - \delta x\sin\theta\cos\varphi)^2}$$

The vector $\vec{d}$=(d, 0, 0), (referring still to FIG. 4A), a surface feature in the x-axis, can be calculated by:

$$P_{\theta,\varphi}(\vec{d}) = d\sin\left(\cos^{-1}(\sin\theta\cos\varphi)\right) = \sqrt{d^2 - d^2\sin^2\theta\cos^2\varphi}$$

3. Finding the Tilt Angle

Once that the vectors $\vec{L}$ and $\vec{d}$ have been defined, one can introduce the squared ratio of the two vectors as follows:

$$R_\theta = \left(\frac{P_{\theta,\varphi}(\vec{d})}{P_{\theta,\varphi}(\vec{L})}\right)^2 = \frac{d^2 - d^2\sin^2\theta\cos^2\varphi}{L^2 - (\delta z\cos\theta - \delta x\sin\theta\cos\varphi)^2}$$

The above ratio is useful since it eliminates any calibrations manipulating the vector measurements. This is because the two vectors are both in the y-axis of the SEM image and will be "stretched" equally under every calibration (we can neglect differences caused by rotation based on the assumption that any error from such is relatively small).

Assuming small angles, one can keep only the first-order terms, and after a few algebraic manipulations, get the tilt offset from 45° (result is given in radians) as:

$$\delta\theta = \frac{d^2 - R_\theta(\delta z + \delta x)^2}{2d^2 + 2R_\theta(\delta z^2 - \delta x^2)}$$

4. Finding the Rotation Angle

Next, still referring to FIG. 4A, one can consider two different vectors, which will be "stretched" equally by calibrations in the horizontal axis this time:

The left height vector $\vec{h_r}$=(λ, −δy, δz):

$$P_{\theta,\varphi}(\vec{h_l}) = \sqrt{h^2 - (\lambda\sin\theta\cos\varphi + \delta y\sin\theta\sin\varphi + \delta z\cos\theta)^2}$$

The right height vector $\vec{h_r}$=(λ, −δy, δz), is essentially the same vector as vector $\vec{h_r}$ but as measured after rotating the wafer 180° while keeping the SEM column steady.

The vectors are the horizontal distance between the lines, such that λ is dependent on the tilt and rotation angles. λ can then be found by using algebra to find the minimum length possible:

$$\lambda = \frac{(\delta y\sin\theta\sin\varphi + \delta z\cos\theta)\sin\theta\cos\varphi}{1 - \sin^2\theta\cos^2\varphi}$$

The squared ratio of the vectors is:

$$R_\varphi = \left(\frac{P_{\theta,\varphi}(\vec{h_l})}{P_{\theta,\varphi}(\vec{h_r})}\right)^2$$

And again, assuming small angles leaving only first-order terms, one gets the rotation angle with the result given in radians:

$$\varphi = \frac{(1 - R_\varphi)\left(\sin^2\beta - 4\delta\theta\right)}{(1 + R_\varphi)\sin 2\beta},\ \beta = \sin^{-1}\left(\frac{\delta y}{\delta z}\right)$$

Since the above calculations include θ, embodiments calculate the rotational angle after calculating the tilt angle.

Thus, to summarize the above, embodiments disclosed herein can avoid a logic loop employed by previously used calibration techniques that could lead to inaccurate estimations of the tilt and rotation angles of the SEM column. The disclosed embodiments can, from a single tilt angle of 45°, take three measurements: d, L, $h_l$. The wafer can then be rotated 180° and $h_l$ can be measured again after the rotation to come up with $h_r$.

Since some basic values are also pre-known, including: δ, δy, δz, α, β. Some can be measured exactly in top-down and the angles are therefore calculated.

Two ratios can then be calculated from the measured values:

$$R_\theta = \left(\frac{d}{L}\right)^2,\ R_\varphi = \left(\frac{h_l}{h_r}\right)^2$$

And finally, the angles (in radians) can be estimated using the calculated ratios and pre-known values as indicated above by formulas above. While the above formulas are particular to calculating precise tilt and rotational angles for stereoscopic images taken at 0 and 45 degrees, the same mathematical principles can be applied to any two angles and a skilled artisan will be able to determine the precise formulas for any two angles used in accordance with the above teachings provided the deviations of the rotational angle are relatively small (e.g., no greater than five degrees).

Additional Embodiments

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. For example, while examples and formulas discussed above used angles of 0 and 45 degrees for stereoscopic measurements, embodiments are not limited to those specific angles. Instead, any two angles in which the SEM column can be positioned can be precisely determined using the techniques discussed above and then used in stereoscopic measurements of features as described herein.

Additionally, while various simplified drawings of holes in which the depth can be measured are discussed herein as examples, it is to be understood that the examples are generally highly simplified drawings for illustrative purposes only. Actual holes milled in samples can have different topographies than those depicted in the figures and embodiments described herein are not limited to any particular shape or topography of milled holes. Additionally, while the profile of the milled boxes or holes discussed above are often depicted in the included figures as being smooth, it should be appreciated that the profile can be rough and jagged on a micro-level without significantly impacting the depth measurement techniques described herein.

Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. It is, therefore, to be understood that the appended claims are intended to cover all such modifications and changes as fall within the true spirit of the embodiments of the disclosure.

Additionally, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system and should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Also, where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of determining a depth of a feature formed in a first region of a sample, the method comprising:

positioning a test structure with known dimensions in a processing chamber having a charged particle column tilted at a first tilt angle and first rotational angle;

determining the first tilt angle and first rotational angle by:

taking an image of the test structure with the charged particle column tilted at the first tilt angle and the first rotational angle;

measuring, based on the image, distances between multiple edges of the test structure aligned with each other along a vector;

determining ratios between the measured distances; and determining a calculated tilt angle and a calculated rotational angle of charged particle column from the ratios and the known dimensions of the structure, wherein calculations to determine the tilt angle and rotation angles are independent of magnification calibration and require neither determination nor assumption of a magnification or scale factor relating image pixels to real-world distances;

transferring the test structure out of the processing chamber and positioning the sample in the processing chamber such that the first region is under a field of view of the charged particle column;

taking a first image of the feature with the column tilted at the first tilt angle and first rotational angle and taking a second image of the feature with the column is tilted at a second tilt angle, different than the first tilt angle, and a second rotational angle; and using stereoscopic measurement techniques to determine the depth of the feature based on the first and second images and the calculated tilt angle and calculated rotational angle.

2. The method of determining a depth of a feature set forth in claim 1 wherein the test structure comprises:

a first set of edges spaced apart from each other and aligned with an X-axis such that, when the first set of edges is projected onto a two dimensional space, a first vector normal to the X-axis intersects each edge in the first set; and a second set of edges spaced apart from each other and aligned with a Y-axis such that, when the second set of edges is projected onto a two dimensional space, a second vector normal to the Y-axis intersects each edge in the second set.

3. The method of determining a depth of a feature set forth in claim 2 wherein the first set of edges comprises three edges and the second set of edges comprises four edges.

4. The method of determining a depth of a feature set forth in claim 3 wherein the test structure is a trapezoidal prism and the distances measured between multiple edges includes a distance of a width of a top surface of the trapezoidal prism, a length of a front surface of the prism, and a length of a side surface of the prism.

5. The method of determining a depth of a feature set forth in claim 4 wherein:

the first set of edges includes first, second and third edges and the second set of edges includes fourth, fifth, sixth and seventh edges; and determining ratios includes determining a first ratio between a distance between the first and second edges to a distance between the second and third edges and a second ratio between a distance between the fourth and fifth edges to a distance between the sixth and seventh edges.

6. The method of determining a depth of a feature set forth in claim 1 wherein the second rotational angle is equal to the first rotational angle.

7. The method of determining a depth of a feature set forth in claim 1 wherein the first tilt angle is approximately 45° to a top surface of the sample and the second tilt angle is approximately normal to the surface of the sample.

8. The method of determining a depth of a feature set forth in claim 1 wherein the charged particle column is a scanning electron microscope (SEM) column.

9. The method of determining a depth of a feature set forth in claim 1 wherein the sample is a semiconductor wafer.

10. The method of determining a depth of a feature set forth in claim 1 wherein the processing chamber is a vacuum chamber that includes both a focused ion beam (FIB) column and a scanning electron microscope (SEM) column.

11. A method of precisely calibrating mechanical tilt and rotation angles of a charged particle column, the method comprising:

positioning a test structure with known dimensions in a processing chamber having a charged particle column tilted at a first tilt angle and first rotational angle;

determining the first tilt angle and first rotational angle by:

taking an image of the test structure with the charged particle column tilted at the first tilt angle and the first rotational angle;

measuring, based on the image, distances between multiple edges of the test structure aligned with each other along a vector;

determining ratios between the measured distances; and determining a calculated tilt angle and a calculated rotational angle of charged particle column from the ratios and the known dimensions of the structure, wherein calculations to determine the calculated tilt and rotation angles are independent of magnification calibration and require neither determination nor assumption of a magnification or scale factor relating image pixels to real-world distances.

12. The method of calibrating mechanical tilt and rotation angles of a charged particle column set forth in claim 11 wherein the test structure comprises:

a first set of edges spaced apart from each other and aligned with an X-axis such that, when the first set of edges is projected onto a two dimensional space, a first vector normal to the X-axis intersects each edge in the first set; and a second set of edges spaced apart from each other and aligned with a Y-axis such that, when the second set of edges is projected onto a two dimensional space, a second vector normal to the Y-axis intersects each edge in the second set.

13. The method of determining a depth of a feature set forth in claim 12 wherein the first set of edges comprises three edges and the second set of edges comprises four edges.

14. The method of calibrating mechanical tilt and rotation angles of a charged particle column set forth in claim 12 wherein the test structure is a trapezoidal prism and the distances measured between multiple edges includes a distance of a width of a top surface of the trapezoidal prism, a length of a front surface of the prism, and a length of a side surface of the prism.

15. The method of determining a depth of a feature set forth in claim 1 wherein the first tilt angle is approximately 45° to the surface of the sample.

16. A system for determining a depth of a hole formed in a first region of a sample, the system comprising:

a vacuum chamber;

a sample support configured to hold a sample within the vacuum chamber during a milling process;

a charged particle beam column configured to direct a charged particle beam into the vacuum chamber;

a processor and a memory coupled to the processor, the memory including a plurality of computer-readable instructions that, when executed by the processor, cause the system to:

position a test structure with known dimensions on the sample support with the charged particle column tilted at a first tilt angle and first rotational angle;

determine the first tilt angle and first rotational angle by:

taking an image of the test structure with the charged particle column tilted at the first tilt angle and the first rotational angle;

measuring, based on the image, distances between multiple edges of the test structure aligned with each other along a vector;

determining ratios between the measured distances; and determining a calculated tilt angle and a calculated rotational angle of charged particle column from the ratios and the known dimensions of the structure, wherein calculations to determine the tilt angle and rotation angles are independent of magnification calibration and require neither determination nor assumption of a magnification or scale factor relating image pixels to real-world distances;

transfer the test structure out of the processing chamber and positioning the sample in the processing chamber such that the first region is under a field of view of the charged particle column;

take a first image of the feature with the column tilted at the first tilt angle and first rotational angle and taking a second image of the feature with the column is tilted at a second tilt angle, different than the first tilt angle, and a second rotational angle; and use stereoscopic measurement techniques to determine the depth of the hole based on the first and second images and the calculated tilt angle and calculated rotational angle.

17. The system for determining a depth of a hole set forth in claim 16 wherein the test structure comprises:

a first set of edges spaced apart from each other and aligned with an X-axis such that, when the first set of edges is projected onto a two dimensional space, a first vector normal to the X-axis intersects each edge in the first set; and a second set of edges spaced apart from each other and aligned with a Y-axis such that, when the second set of edges is projected onto a two dimensional space, a second vector normal to the Y-axis intersects each edge in the second set.

18. The system for determining a depth of a hole set forth in claim 16 wherein the test structure is a trapezoidal prism and the distances measured between multiple edges includes a distance of a width of a top surface of the trapezoidal prism, a length of a front surface of the prism, and a length of a side surface of the prism.

19. The system for determining a depth of a hole set forth in claim 16 wherein the charged particle column is a scanning electron microscope (SEM) column that directs an electron beam into the chamber.

20. The system for determining a depth of a hole set forth in claim 16 wherein the processing chamber is a vacuum chamber that includes both a focused ion beam (FIB) column and a scanning electron microscope (SEM) column.

* * * * *